(12) United States Patent
Toyokawa et al.

(10) Patent No.: US 7,394,141 B2
(45) Date of Patent: Jul. 1, 2008

(54) SUBSTRATE FOR FORMING A SOLID-STATE IMAGE PICKUP ELEMENT, SOLID-STATE IMAGE PICKUP ELEMENT USING THE SAME, AND METHOD OF PRODUCING THE SAME

(75) Inventors: Fumitoshi Toyokawa, Miyagi (JP); Haru Okawa, Miyagi (JP); Eiichi Okamoto, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 163 days.

(21) Appl. No.: 11/311,344

(22) Filed: Dec. 20, 2005

(65) Prior Publication Data

US 2006/0151813 A1 Jul. 13, 2006

(30) Foreign Application Priority Data

Dec. 21, 2004 (JP) .................. P.2004-369596

(51) Int. Cl.
*H01L 31/062* (2006.01)
*H01L 31/113* (2006.01)

(52) U.S. Cl. ............... 257/463; 257/291; 257/461; 257/E31.272

(58) Field of Classification Search ........... 257/291, 257/461, 463, E31.272
See application file for complete search history.

(56) References Cited

U.S. PATENT DOCUMENTS 5,386,108 A * 1/1995 Arikawa et al. ......... 250/208.1
2002/0000242 A1 * 1/2002 Matushiita et al. ......... 136/244

FOREIGN PATENT DOCUMENTS

JP 2003-92301 A 3/2003

* cited by examiner

*Primary Examiner*—Evan Pert
*Assistant Examiner*—Victor A. Mandala, Jr.
(74) *Attorney, Agent, or Firm*—Birch, Stewart, Kolasch & Birch, LLP

(57) ABSTRACT

A substrate for a solid-state image pickup element, comprising: an n-type silicon substrate; and an n-type epitaxial growth layer formed on a surface of the n-type silicon substrate, wherein the substrate is configured to form a solid-state image pickup element in the n-type epitaxial growth layer, the solid-state image pickup element comprising: a photoelectric converting section; and a charge transferring section having charge transfer electrodes which transfer charges produced in the photoelectric converting section, and the n-type silicon substrate has a specific resistance of $10/_{1,000}$ Ωcm or less.

9 Claims, 11 Drawing Sheets

SUBSTRATE FOR FORMING A SOLID-STATE IMAGE PICKUP ELEMENT, SOLID-STATE IMAGE PICKUP ELEMENT USING THE SAME, AND METHOD OF PRODUCING THE SAME

BACKGROUND OF THE INVENTION

1. Field of the Invention

The present invention relates to a substrate for forming a solid-state image pickup element, a solid-state image pickup element using the substrate, and a method of producing the substrate, and more particularly to an improvement in the performance of a solid-state image pickup element.

2. Description of the Related Art

A solid-state image pickup element using a CCD which is employed in an area sensor or the like has: a photoelectric converting section configured by photodiodes or the like; a charge transferring section having charge transfer electrodes which transfer signal charges supplied from the photoelectric converting section; and a wiring section connected to these components. The charge transfer electrodes are adjacently placed on a charge transfer path formed on a semiconductor substrate, and sequentially driven.

Recently, in accordance with an increased number of pixels of a CCD, requests for a higher resolution and a higher sensitivity are growing in a solid-state image pickup element The number of imaging pixels is increased to gigapixels or more.

Under such circumstances, in order to ensure a high sensitivity, since it is difficult to reduce a light receiving area, an area occupied by charge transfer electrodes is forced to be reduced.

Under such circumstances, also requests for improving the performance of a semiconductor substrate for forming a solid-state image pickup element are increasing.

As a semiconductor substrate for forming a solid-state image pickup element, a CZ substrate grown by the Czochralski (CZ) method, an MCZ substrate grown by the magnetic Czochralski (MCZ) method, an epitaxial semiconductor substrate in which an epitaxial layer is formed on the surface of such a CZ or MCZ substrate, and the like are conventionally used.

On the other hand, today, a step of forming a semiconductor device is performed in a super clean room having a very high cleanliness. However, contamination of a semiconductor substrate due to impurities from gasses, water, a semiconductor producing apparatus, and the like cannot be completely avoided. The amounts of impurities which are introduced into a semiconductor substrate in a step of forming an epitaxial layer on the surface of the semiconductor substrate are said to be larger than those of impurities which are introduced in a step of forming a semiconductor device.

When an impurity or a crystal defect exists in an element active region of a semiconductor substrate, the quality and characteristics of a semiconductor device are significantly deteriorated. When an impurity or a crystal defect exists in a semiconductor substrate, the semiconductor substrate is susceptible to an irradiation damage due to radiation such as α rays. This damage causes the quality and characteristics of a semiconductor device to be further deteriorated.

In order to remove away such an impurity or a crystal defect from an element active region, intrinsic gettering (IG) based on oxygen precipitation from the interior of a substrate, and extrinsic gettering (EG) not involving oxygen precipitation are conventionally performed (for example, JP-A-2003-92301).

For example, the intrinsic gettering process is performed by executing a two-step heat treatment on a silicon wafer in which an epitaxial growth layer is formed. The two-step heat treatment is configured by an outward diffusion heat treatment in which the wafer is heated in a high-temperature oxygen atmosphere, and a heat treatment for forming a low-temperature oxygen precipitation nucleus. In this way, the intrinsic gettering process is a treatment in which an oxygen precipitation defect is used as the medium. Therefore, it is the that, when the dopant concentration of a substrate exceeds $10^{18}$ cm$^{-3}$, the gettering effect is suppressed in an N$^+$ substrate (for example, "Silicon no kagaku" UCS Handotai Kiban Gijutsu Kenkyukai, pp. 602-607).

Under the situations, as miniaturization of a solid-state image pickup element is further advancing, occurrence of a white scratch defect becomes more problematic. A white scratch defect corresponds to a dark current caused by an impurity or the like, and hence gettering is indispensable. In the case where a high-temperature step is necessary, however, a special apparatus may be required, or a problem of warpage or distortion of a substrate may become more serious on the contrary.

SUMMARY OF THE INVENTION

The invention has been conducted in view of these circumstances. It is an object of the invention to provide a substrate for forming a solid-state image pickup element which can easily provide a solid-state image pickup element having excellent characteristics, without producing defects such as a white scratch defect.

The substrate for a solid-state image pickup element of the invention is characterized in that the substrate comprises: an n-type silicon substrate; and an n-type epitaxial growth layer which is formed on a surface of the n-type silicon substrate, the substrate is configured to form a solid-state image pickup element in the n-type epitaxial growth layer, the solid-state image pickup element comprising: a photoelectric converting section; and a charge transferring section having charge transfer electrodes which transfer charges produced in the photoelectric converting section, and the n-type silicon substrate has a specific resistance of $^{10}/_{1,000}$ Ωcm or less.

According to the configuration, in a thermal step in processing steps, heavy-metal contamination is spontaneously sucked into the n-type silicon substrate which is a heavily-doped impurity region, and the epitaxial growth layer which is an element forming region constitutes a clean functional layer which is free from contamination such as heavy-metal contamination. Furthermore, the substrate can be formed without passing through a special high-temperature step. In the formation, no special apparatus is required, and an economical method is employed. The gettering layer exists until the final product is formed, and therefore an epitaxial growth layer which is very clean can be formed. Since a high-temperature step is not necessary, defects such as distortion never occur in processing steps.

Moreover, the n-type silicon substrate has a low resistance. When the substrate is used as a solid-state image pickup element, therefore, the invention is effective also in reduction of the pull-out voltage of an electronic shutter.

Since the n-type silicon substrate has a low resistance, carriers are efficiently absorbed. Therefore, hot-electron luminescence from a transistor region or the like in an electronic circuit can be satisfactorily absorbed, and an influence on a pixel region can be reduced.

In the art, it has been considered that an n-type silicon substrate having a specific resistance of $10/1,000$ Ωcm or less exerts no effect on the IG process. An application of such a substrate to the process has not been studied.

The substrate for a solid-state image pickup element of the invention embraces a substrate in which the n-type epitaxial growth layer has a specific resistance of 0.1 Ωcm or more.

According to the configuration, the concentration gradient with respect to the n-type silicon substrate is sufficient, and hence the gettering effect is efficiently produced.

The substrate for a solid-state image pickup element of the invention embraces a substrate in which an n-type impurity of the n-type silicon substrate is phosphorus.

According to the configuration, when the n-type impurity is phosphorus, the solid solubility limit of a heavy metal is made higher, and the gettering effect is further enhanced.

The substrate for a solid-state image pickup element of the invention embraces a substrate in which an n-type impurity of the n-type silicon substrate is arsenic.

According to the configuration, when the n-type impurity is arsenic, the solid solubility limit of a heavy metal is made higher, and the gettering effect is further enhanced.

The substrate for a solid-state image pickup element of the invention embraces a substrate in which the n-type silicon substrate has an n-type impurity concentration of $5 \times 10^{18}$ cm$^{-3}$ or more.

According to the configuration, since the concentration of an n-type impurity is sufficiently high, the solid solubility limit of a heavy metal is made higher, and the gettering effect is further enhanced.

The substrate for a solid-state image pickup element of the invention embraces a substrate in which the n-type silicon substrate has a specific resistance of $3/1,000$ Ωcm or less.

When the n-type impurity is phosphorus, the specific resistance is preferably equal to or less than $3/1,000$ Ωcm.

The substrate for a solid-state image pickup element of the invention embraces a substrate in which the n-type silicon substrate has a specific resistance of $5/1,000$ Ωcm or less.

When the n-type impurity is arsenic, the specific resistance is preferably equal to or less than $5/1,000$ Ωcm.

The substrate for a solid-state image pickup element of the invention embraces a substrate in which all electrode lead terminals are formed on a side of the surface on which the n-type epitaxial growth layer is formed.

Also in a substrate in which all electrode lead terminals are formed on a side of the surface on which the n-type epitaxial growth layer is formed, when a high-concentration substrate is used not for contact, but for gettering, gettering can be efficiently performed, and a solid-state image pickup element of high reliability can be obtained.

The solid-state image pickup element of the invention is characterized in that the solid-state image pickup element is formed in the n-type epitaxial growth layer of the substrate for a solid-state image pickup element, and comprises: a photoelectric converting section; and a charge transferring section having charge transfer electrodes which transfer charges produced in the photoelectric converting section.

According to the configuration, in a thermal step in processing steps, heavy-metal contamination is spontaneously sucked into the n-type silicon substrate which is a heavily-doped impurity region, and the epitaxial growth layer which is an element forming region constitutes a clean functional layer which is free from contamination such as heavy-metal contamination. Therefore, it is possible to provide a solid-state image pickup element of high reliability. Furthermore, the substrate can be formed without passing through a special high-temperature step. In the formation, no special apparatus is required, and an economical method is employed. The gettering layer exists until the final product is formed, and therefore an epitaxial growth layer which is very clean can be maintained. It is possible to form a solid-state image pickup element of high reliability and having a long lifetime. Since a high-temperature step is not necessary, defects such as distortion never occur in processing steps.

Moreover, the n-type silicon substrate constituting the solid-state image pickup element has a low resistance. When the substrate is used as a solid-state image pickup element, therefore, the invention is effective also in reduction of the pullout voltage of an electronic shutter.

Since the n-type silicon substrate constituting the solid-state image pickup element has a low resistance, carriers are efficiently absorbed. Therefore, hot-electron luminescence from a transistor region or the like in an electronic circuit which is a signal processing circuit can be satisfactorily absorbed, and an influence on a pixel region can be reduced.

The method of producing a solid-state image pickup element of the invention includes a step of, in the n-type epitaxial growth layer of the substrate for a solid-state image pickup element, forming a photoelectric converting section, and a charge transferring section having charge transfer electrodes which transfer charges produced in the photoelectric converting section, thereby forming a solid-state image pickup element.

According to the method, in a thermal step such as an impurity diffusion step, the n-type silicon substrate functions as a gettering site, and can efficiently absorb heavy metals, defects, and the like. Therefore, a solid-state image pickup element of high reliability can be formed. Furthermore, the absorption to the n-type silicon substrate is efficiently performed by the concentration gradient without requiring a special thermal step.

In this way, a semiconductor substrate in which the gettering ability is strong and maintained for a long term, and which is very effective for a solid-state image pickup element can be provided simply by selecting a high-concentration substrate as a substrate.

DETAILED DESCRIPTION OF THE INVENTION

Hereinafter, an embodiment of the invention will be described in detail with reference to the accompanying drawings.

Figure 1:
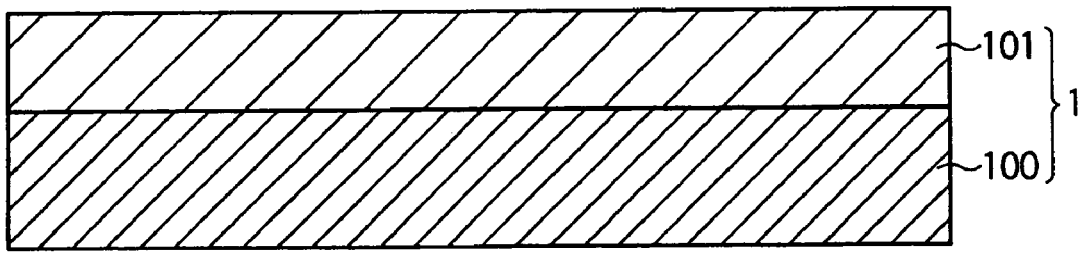
FIG. 1 is a section view showing a substrate for a solid-state image pickup element which is an embodiment of the invention.

The embodiment is characterized in that, as shown in FIG. 1, phosphorus is used as a dopant, a silicon wafer 1 in which an n-type epitaxial growth layer 101 having a film thickness of 10 µm and a specific resistance of 10 Ωcm is deposited on the surface of an n-type silicon substrate 100 having an n-type impurity concentration of $5 \times ^{19}$ cm$^{-3}$ is used as a substrate for forming a solid-state image pickup element, and a solid-state image pickup element is formed on the surface of the n-type epitaxial growth layer 101.

As described above, a substrate having a high concentration of phosphorus is used, gettering of heavy metals is efficiently executed by a thermal treatment in an element forming step, and a clean n-type epitaxial growth layer 102 which is free from heavy-metal contamination is obtained, thereby providing a solid-state image pickup element of high reliability.

First, a step of forming the silicon wafer will be described.

Figure 2A:
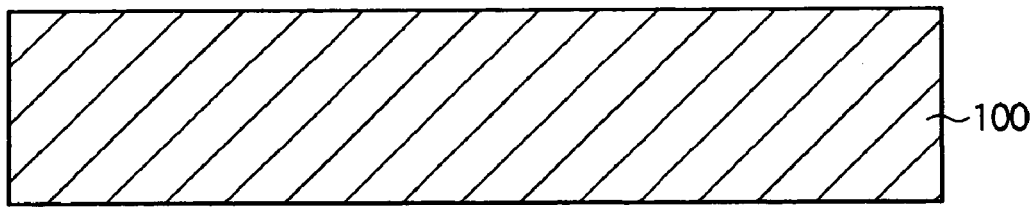
FIGS. 2A and 2B are views showing steps of producing the substrate for a solid-state image pickup element.

As shown FIG. 2A, a seed crystal is immersed in a silicon melt to which P is added so as to attain a desired phosphorus concentration. Then, the seed crystal is pulled up at a desired speed by the CZ method to form a silicon ingot. Thereafter, the ingot is sliced, and the CZ substrate 100 is prepared. In the CZ substrate 100, the <100> plane is set as the mirror surface, the resistivity is 0.002 Ωcm, and the concentration of phosphorus is $5 \times 10^{19}$ atoms cm$^{-3}$. The CZ substrate 100 is washed with an aqueous solution of $NH_4OH/H_2O_2$, and further washed with an aqueous solution of $HCl/H_2O_2$.

Figure 2B:
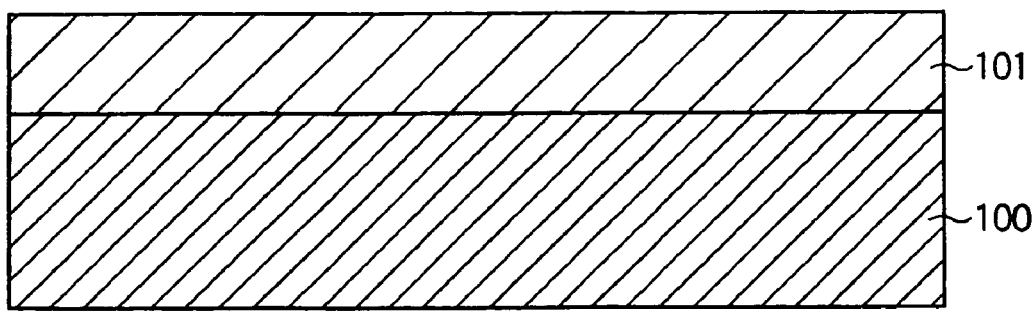

Next, as shown in FIG. 2B, the silicon wafer 1 configured by the silicon substrate 100 is completed. In the silicon substrate, the epitaxial layer 101 having an impurity concentration of $5.0 \times 10^{14}$ cm$^{-3}$ and a resistivity of about 10 Ωcm is grown on the mirror surface to a thickness of about 10 µm at a temperature of about 1,150° C. with using $SiHCl_3$ gas containing $PH_3$.

With using the silicon wafer 1 as the starting material then, a solid-state image pickup element is formed in the n-type epitaxial growth layer.

As the solid-state image pickup element, any kind of solid-state image pickup element can be used. In the embodiment, a solid-state image pickup element comprising charge transfer electrodes having a single-electrode structure will be exemplarily described.

Figure 3:
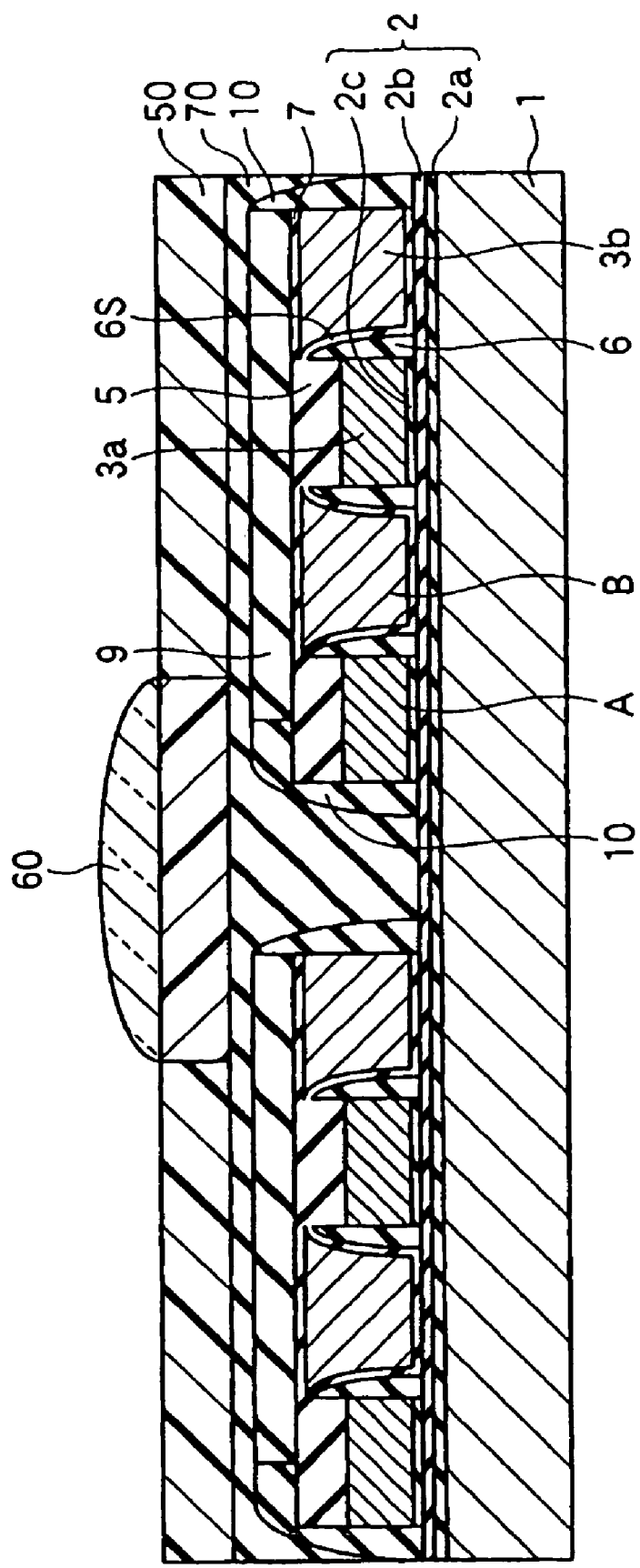
FIG. 3 is a section view showing the solid-state image pickup element of the embodiment of the invention.
Figure 4:
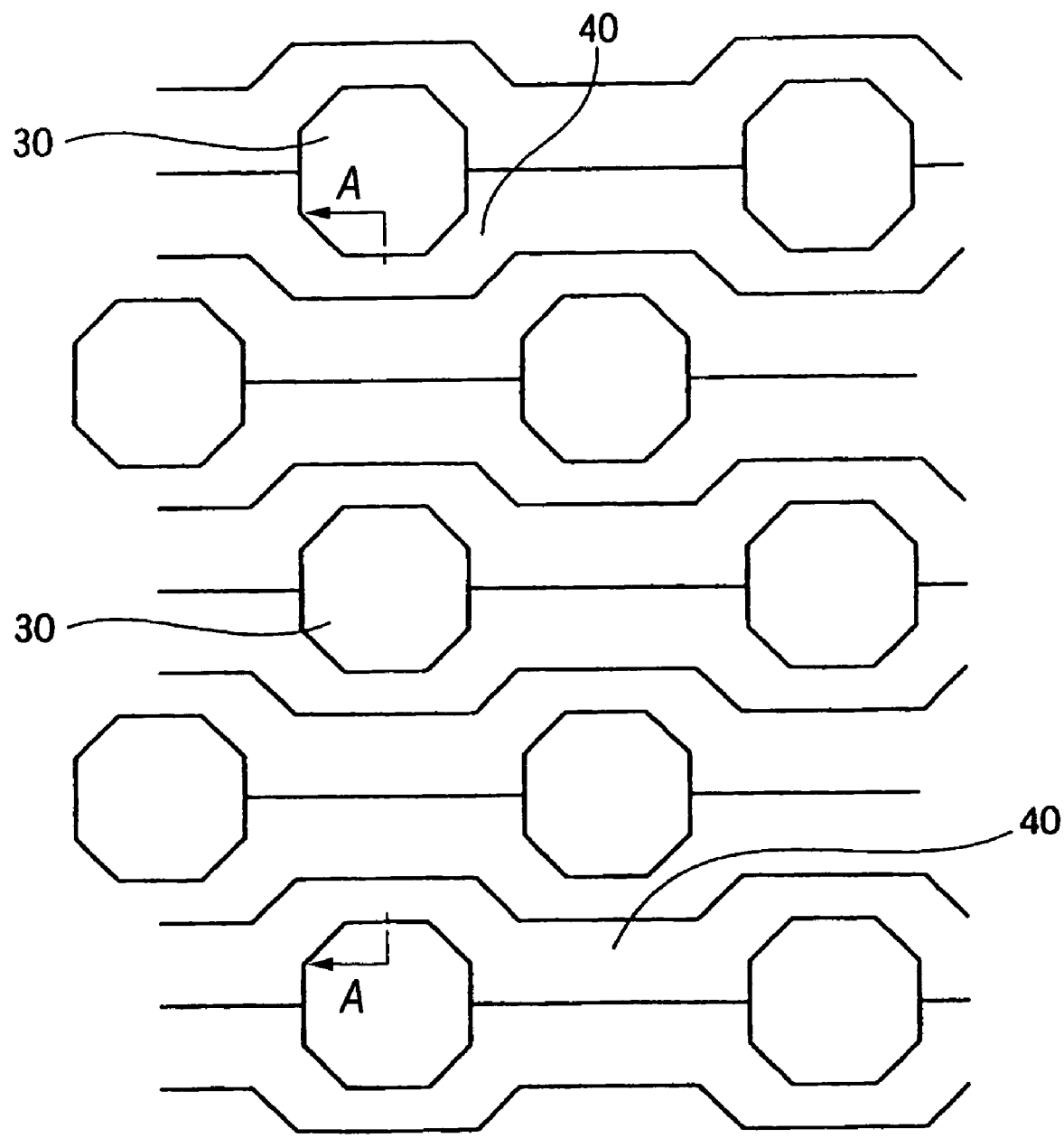
FIG. 4 is a plan view showing the solid-state image pickup element of the embodiment of the invention.

In the solid-state image pickup element, as shown FIGS. 3 and 4, charge transfer electrodes have a single-electrode structure in which a first electrode A formed by a polycrystalline silicon layer serving as a first conductive film 3a, and a second electrode B formed by a polycrystalline silicon layer serving as a second conductive film 3b are alternately juxtaposed. An interelectrode insulating film is configured by a sidewall insulating film configured by an HTO film formed by the CVD method.

The other configuration is identical with that of a conventional solid-state image pickup element. The solid-state image pickup element comprises: a photoelectric converting section 30; and a charge transferring section 40 having the charge transfer electrodes which transfer charges produced in the photoelectric converting section 30, and further comprises an intermediate layer 70 including films such as: a light shielding film (not shown) which is formed so as to have an opening in the photoelectric converting section; and a planarizing film configured by a BPSG (borophospho silicate glass) film which fills the photoelectric converting section so as to make the surface substantially flat. A filter 50 and a lens 60 are formed on the intermediate layer 70.

A gate oxidization film 2 is configured by a three-layer structure film of a silicon oxide film 2a, a silicon nitride film 2b, and a silicon oxide film 2c.

FIG. 3 is a cross section diagram, and FIG. 4 is plan diagram. A plurality of photodiode regions 30 are formed in the silicon wafer 1. The charge transferring section 40 for transferring signal charges detected in the photodiode regions 30 is formed between the photodiode regions 30.

Although not shown in FIG. 4, charge transferring channels through which signal charges transferred by the charge transfer electrodes are moved are formed in a direction crossing the direction along which the charge transferring section 40 elongates.

In FIG. 4, a part of the interelectrode insulating film which is formed in the vicinity of interfaces between the photodiode regions 30 and the charge transferring section 40 is omitted.

As shown in FIG. 3, the photodiodes 30, the transferring channels (not shown), channel stop regions (not shown), and charge reading regions (not shown) are formed in the silicon wafer 1. The gate oxidization film 2 is formed on the surface of the n-type epitaxial growth layer 101 of the silicon wafer 1. On the surface of the gate oxidization film 2, the charge transfer electrodes (the first electrode A formed by the first conductive film 3a, and the second electrode B formed by the second conductive film 3b), and the interelectrode insulating film 6 serving as the sidewall insulating film configured by the HTO film (silicon oxide film) formed on the sidewall of the first electrode A are formed so as to be juxtaposed, thereby configuring the single-electrode structure.

The charge transferring section 40 is configured as described above. As shown in FIG. 3, the intermediate layer 70 is formed on the upper faces of the charge transfer electrodes of the charge transferring section 40. An antireflection layer consisting of a light shielding film and a silicon nitride film which are not shown is disposed in the whole area excluding the photodiode regions 30 (the photoelectric converting section). The planarizing film configured by the BPSG film is formed in recessed portions. A passivation film configured by a transparent resin film is disposed above the planarizing film.

The color filter 50 and the microlens 60 are disposed above the intermediate layer 70. As required, a planarizing layer configured by an insulative transparent resin or the like may fill the space between the color filter 50 and the microlens 60.

In the embodiment, the solid-state image pickup element of the so-called honeycomb structure has been described. It is a matter of course that the invention can applied also to a solid-state image pickup element having a square lattice pattern.

Although the steps of producing the solid-state image pickup element are performed by a usual method, an example will be described.

First, the silicon oxide film 2a having a thickness of 15 nm, the silicon nitride film 2b having a thickness of 50 nm, and the silicon oxide film 2c having a thickness of 10 nm are formed on the surface of the n-type epitaxial growth layer 101 of the silicon wafer 1 and having an impurity concentration of $5.0 \times 10^{14}$ cm$^{-3}$, thereby forming the gate oxidization film 2 of the three-layer structure.

Figure 5:
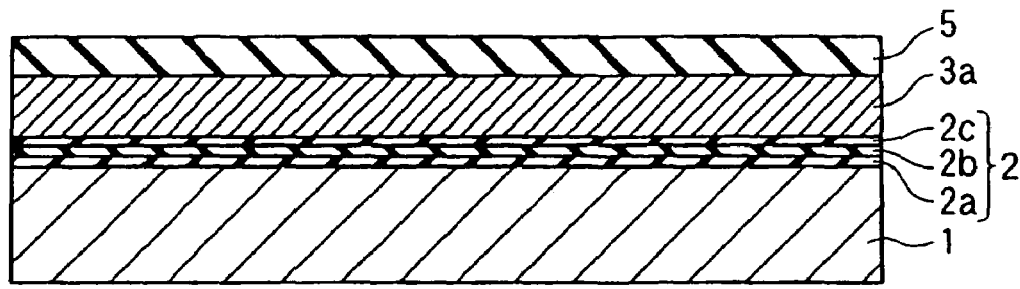
FIG. 5 is a view showing a step of producing the solid-state image pickup element of the embodiment of the invention.

Then, a first layer polycrystalline silicon film serving as the first conductive film 3a having a thickness of 50 to 300 nm is formed on the gate oxidization film 2 by the low-pressure CVD method. In the formation, the substrate temperature is 500 to 600° C. The HTO film 5 having a thickness of 50 to 300 nm is sequentially stacked above the film at a substrate temperature of 850° C. (700 to 850° C.) by the CVD method (FIG. 5).

Figure 6:
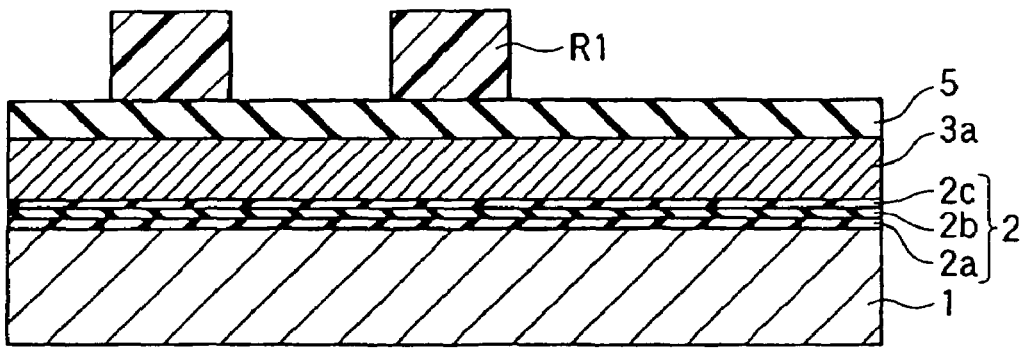
FIG. 6 is a view showing a step of producing the solid-state image pickup element of the embodiment of the invention.

Thereafter, a first resist pattern R1 is formed by photolithography (FIG. 6).

Figure 7:
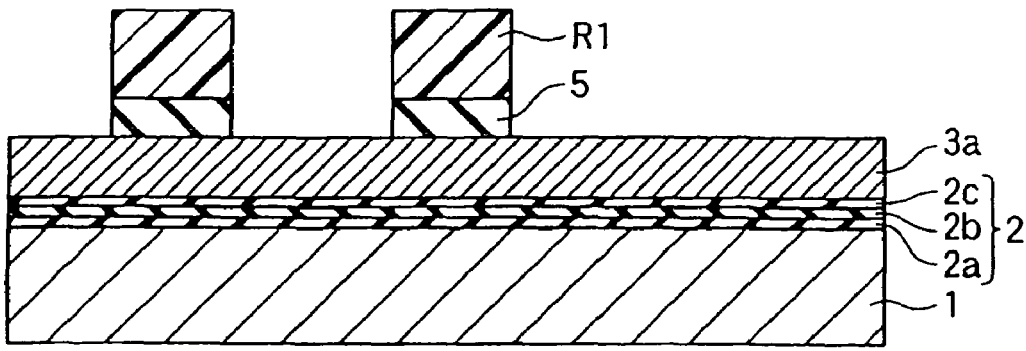
FIG. 7 is a view showing a step of producing the solid-state image pickup element of the embodiment of the invention.
Figure 8:
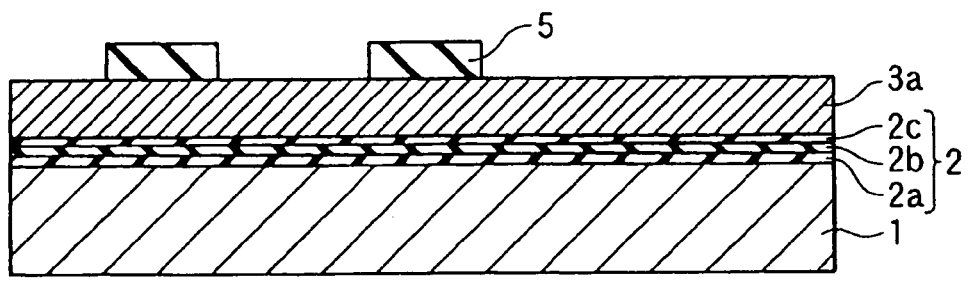
FIG. 8 is a view showing a step of producing the solid-state image pickup element of the embodiment of the invention.

Then, the HTO film 5 is etched by reactive ion etching using $CHF_3$, $C_2F_6$, $O_2$, and He (FIG. 7), and the resist pattern R1 is removed away by ashing to form a hard mask (FIG. 8).

Figure 9:
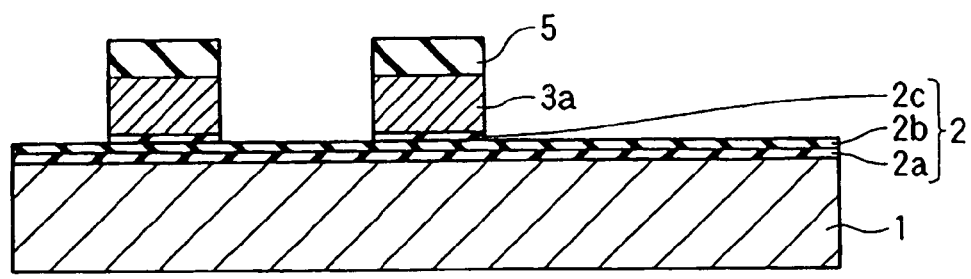
FIG. 9 is a view showing a step of producing the solid-state image pickup element of the embodiment of the invention.

Using the hard mask which is obtained as described above, and which is configured by the HTO film 5, the first conductive film 3a is etched (FIG. 9). In this etching, reactive ion etching using mixed gas of HBr and $O_2$ is performed to form a first electrode and wirings of peripheral circuits. In this case, an etching apparatus of the ECR (Electron Cycrotoron Resonance) method or the ICP (Inductively Coupled Plasma) method is preferably used. A dummy pattern (not shown) is formed in an area which is outside the peripheral circuits, and in which the wiring density is low.

Figure 10:
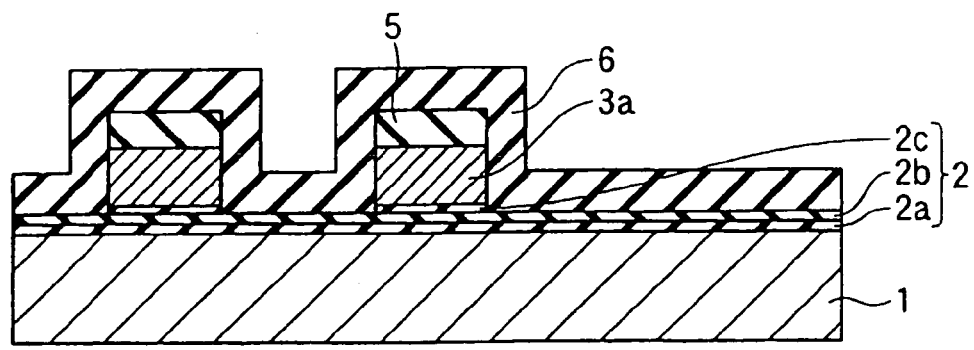
FIG. 10 is a view showing a step of producing the solid-state image pickup element of the embodiment of the invention.

Thereafter, an HTO (silicon oxide) film 6 having a thickness of 50 to 400 nm is formed on the first conductive film by the low-pressure CVD method (FIG. 10).

Figure 11:
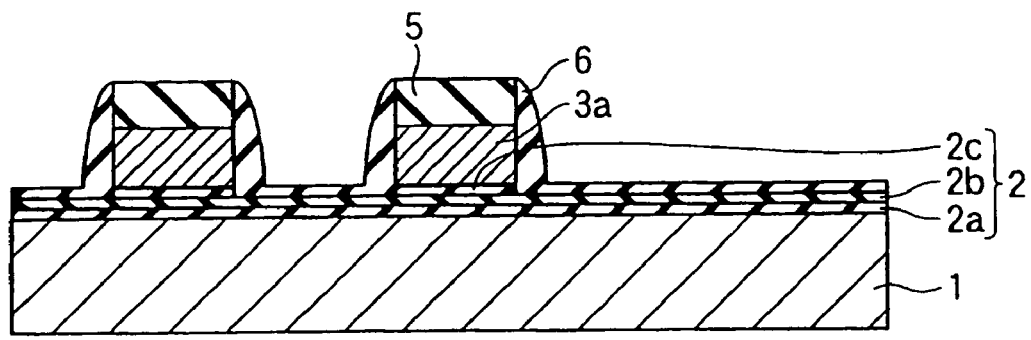
FIG. 11 is a view showing a step of producing the solid-state image pickup element of the embodiment of the invention.

The silicon oxide film 6 which is deposited on a horizontal portion is removed away by reactive ion etching, and the film 6 on the sidewall is caused to remain to form a sidewall insulating film (FIG. 11). At this time, in order to reduce a damage of the substrate surface by the reactive ion etching, a slight amount (about 25 to 50 nm) of the film is caused to remain on the horizontal portion.

Figure 12:
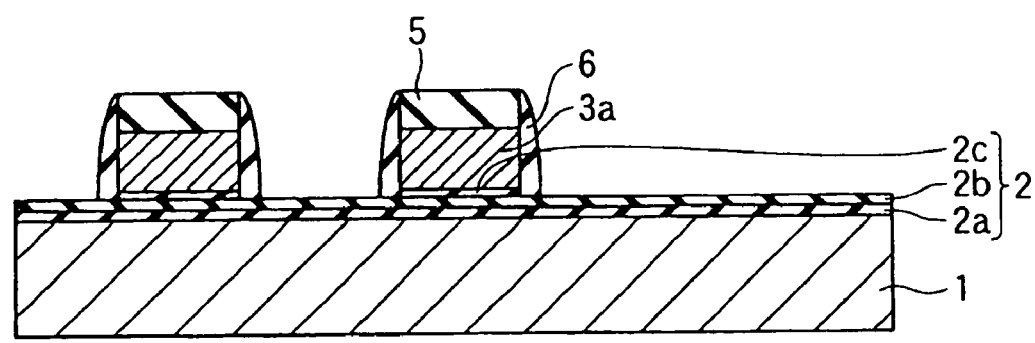
FIG. 12 is a view showing a step of producing the solid-state image pickup element of the embodiment of the invention.

Then, the silicon oxide film remaining on the horizontal portion is removed away by wet etching (FIG. 12).

Figure 13:
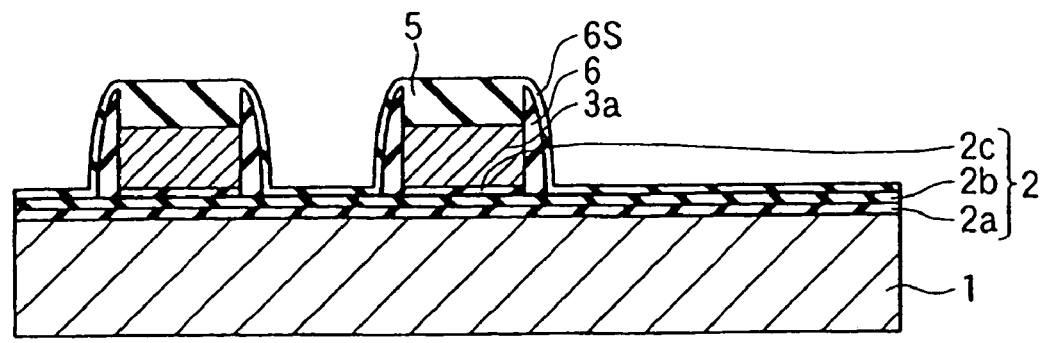
FIG. 13 is a view showing a step of producing the solid-state image pickup element of the embodiment of the invention.

Thereafter, a further HTO film 6S is formed by the low-pressure CVD method to replenish the HTO film which has been removed away by the wet etching. The HTO (silicon oxide) film 6S having a thickness of 3 to 10 nm is formed as a top oxide film of the ONO film (FIG. 13).

Figure 14:
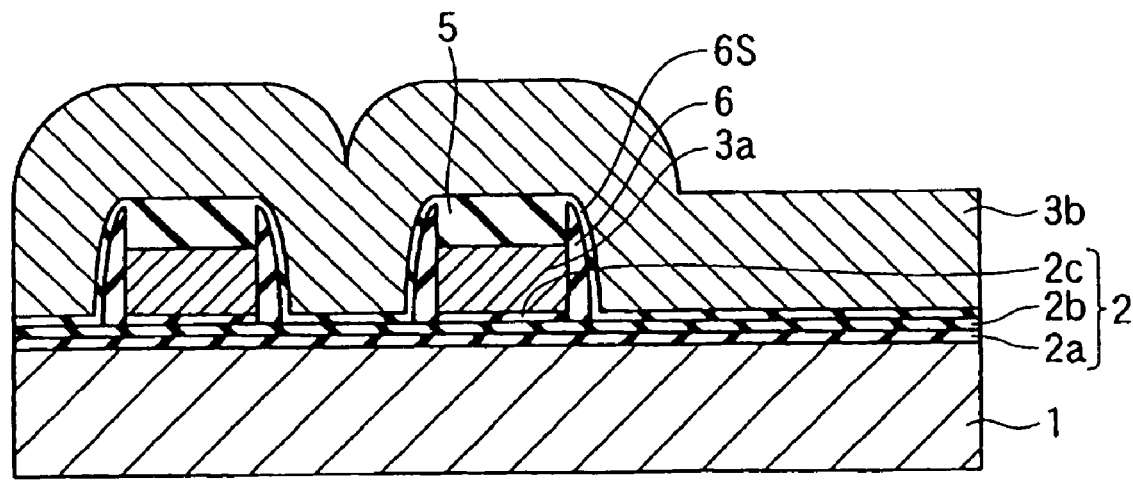
FIG. 14 is a view showing a step of producing the solid-state image pickup element of the embodiment of the invention.

Then, on the HTO film, a polycrystalline silicon film serving as the second conductive film 3b is formed by the low-pressure CVD method so as to be higher than the height of the first conductive film 3a. In the formation, the substrate temperature is 500 to 600° C. (FIG. 14).

Figure 15:
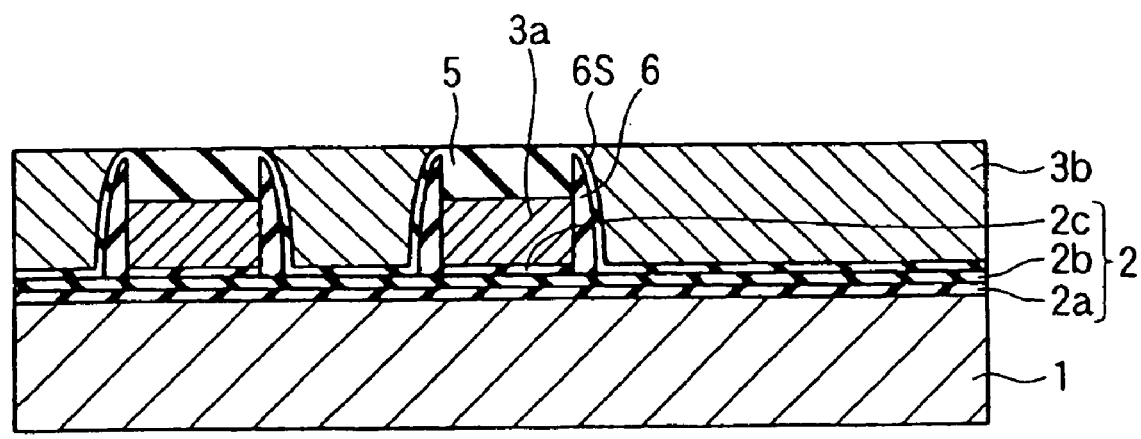
FIG. 15 is a view showing a step of producing the solid-state image pickup element of the embodiment of the invention.

The second conductive film 3b in a projecting portion is removed away by the CMP method to planarize the surface (FIG. 15).

Figure 16:
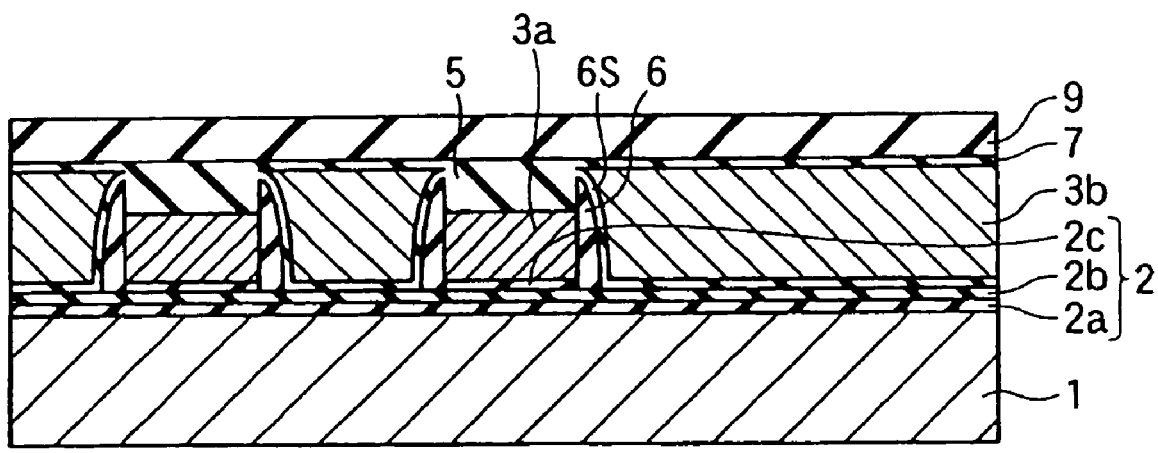
FIG. 16 is a view showing a step of producing the solid-state image pickup element of the embodiment of the invention.

Then, an HTO film 7 having a thickness of 50 nm or less is formed by the low-pressure CVD method (FIG. 16).

The second electrode (second conductive film) is patterned to open a window for the photoelectric converting section.

In the same manner as the patterning of the first electrode, first, a silicon nitride film 9 for forming a hard mask and having a thickness of 50 nm or less is formed by the low-pressure CVD method.

Figure 17:
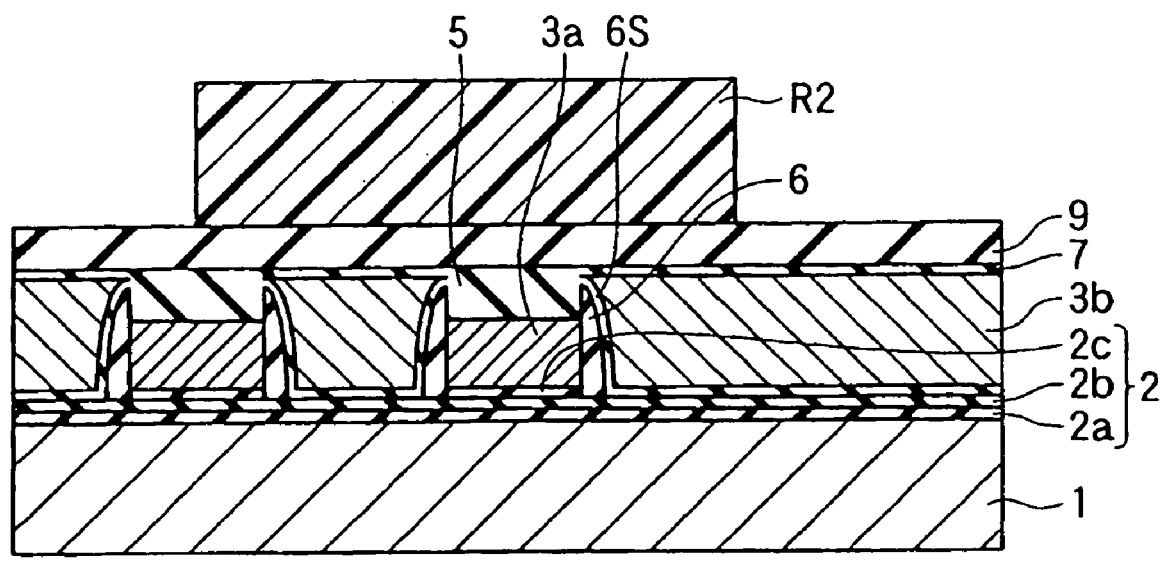
FIG. 17 is a view showing a step of producing the solid-state image pickup element of the embodiment of the invention.

Thereafter, a second resist pattern R2 is formed by photolithography (FIG. 17).

Figure 18:
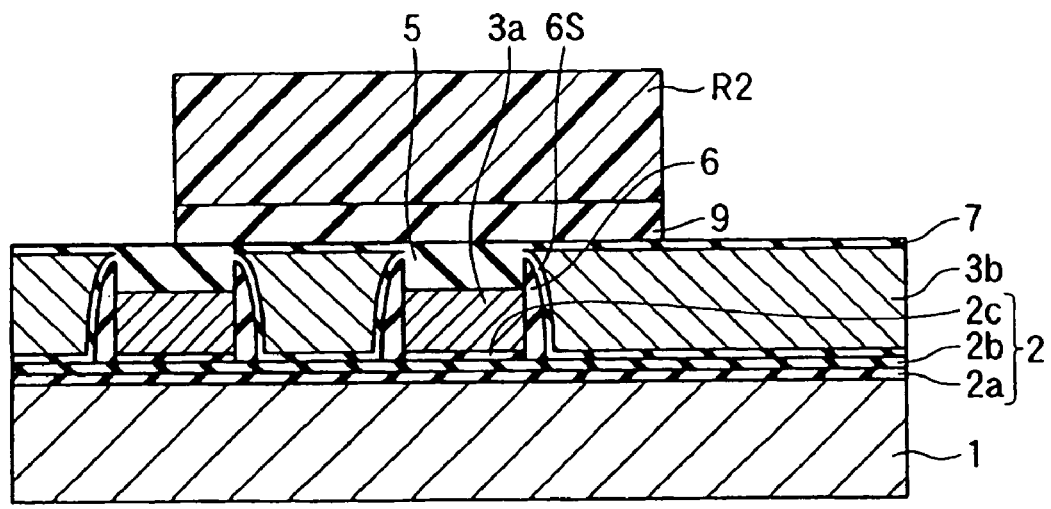
FIG. 18 is a view showing a step of producing the solid-state image pickup element of the embodiment of the invention.
Figure 19:
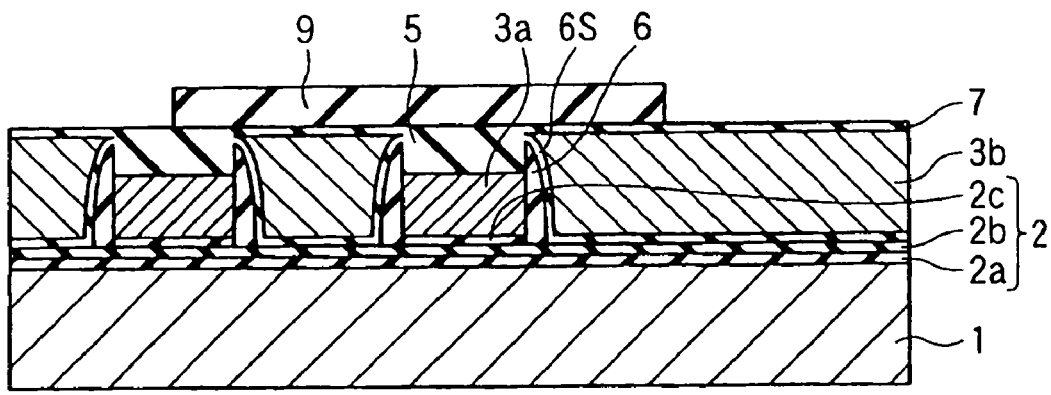
FIG. 19 is a view showing a step of producing the solid-state image pickup element of the embodiment of the invention.

Then, the silicon nitride film 9 is etched by reactive ion etching using $CHF_3$, $CF_4$, and Ar (FIG. 18), and the resist pattern R2 is removed away by ashing to form a hard mask (FIG. 19).

Figure 20:
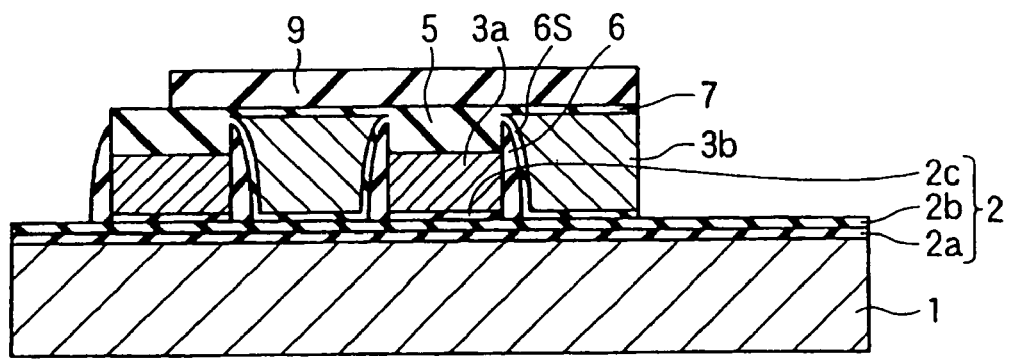
FIG. 20 is a view showing a step of producing the solid-state image pickup element of the embodiment of the invention.

Using the silicon nitride film 9 as a mask, the HTO film is patterned by reactive ion etching using $CHF_3$, $CF_4$, and Ar. Using the hard mask which is obtained as described above, and which is configured by the HTO film 7 and the silicon nitride film 9, the polycrystalline silicon film serving as the second conductive film 3b is etched (FIG. 20). In this etching, reactive ion etching using mixed gas of HBr and $O_2$ or $Cl_2$ and $O_2$ is performed to form a window for the photoelectric converting section. In this case, an etching apparatus of the ECR method or the ICP method is preferably used.

Figure 21:
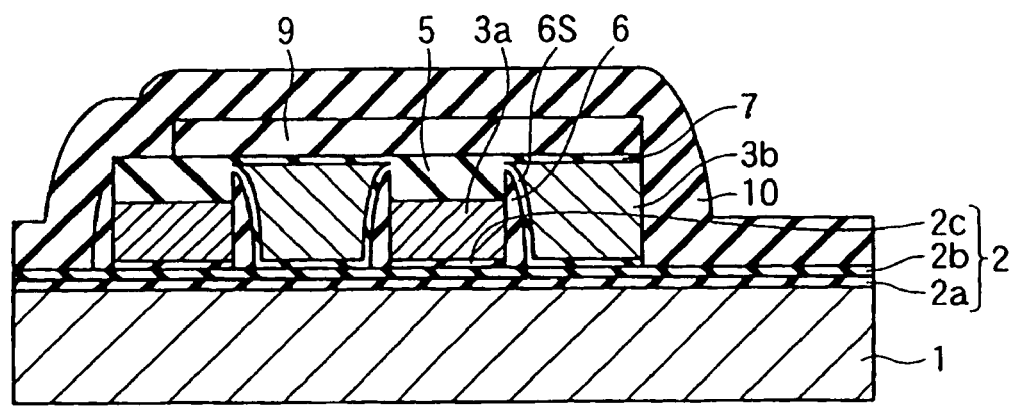
FIG. 21 is a view showing a step of producing the solid-state image pickup element of the embodiment of the invention.

Then, an HTO (silicon oxide) film 10 having a thickness of 500 nm is formed (FIG. 21).

Figure 22:
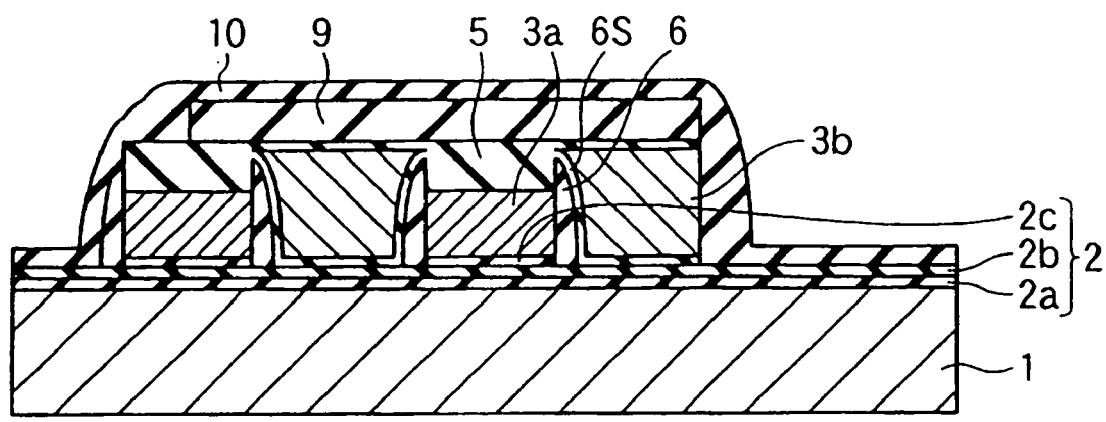
FIG. 22 is a view showing a step of producing the solid-state image pickup element of the embodiment of the invention.

The HTO film 10 which is deposited on a horizontal portion is removed away by reactive ion etching, and the film 10 on the sidewall is caused to remain to form a sidewall insulating film (FIG. 22). At this time, in order to reduce a damage of the substrate surface by the reactive ion etching, a slight amount of the film is caused to remain on the horizontal portion.

Figure 23:
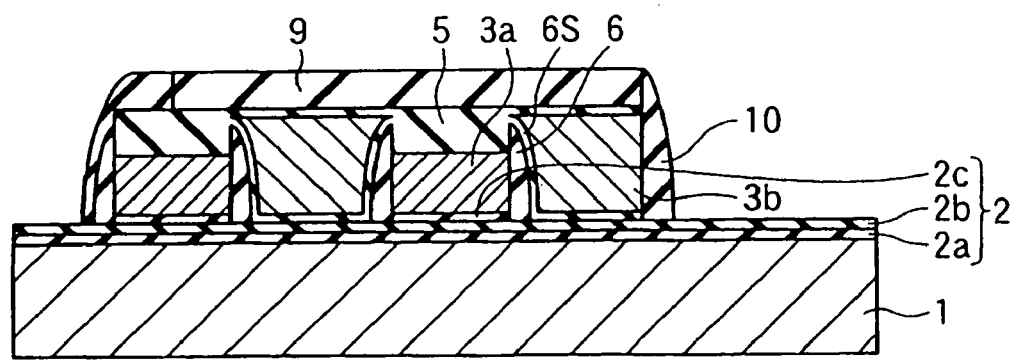
FIG. 23 is a view showing a step of producing the solid-state image pickup element of the embodiment of the invention.

Then, the HTO film 10 remaining on the horizontal portion is removed away by wet etching (FIG. 23).

In this way, the charge transfer electrodes having a low resistance are formed.

Then, the antireflection layer, and the intermediate layer 70 such as the light shielding layer and the planarizing film are formed, and the color filter 50 and the microlens 60 are formed, so that the solid-state image pickup element shown in FIGS. 3 and 4 is obtained.

According to the solid-state image pickup element, in a thermal step such as an impurity diffusion step, the n-type silicon substrate which is a heavily-doped impurity region functions as a gettering site, and can efficiently absorb heavy metals, defects, and the like. Therefore, a solid-state image pickup element of high reliability can be formed. Furthermore, the absorption to the n-type silicon substrate is efficiently performed by the concentration gradient between the n-type epitaxial growth layer 101 which is an element forming region, and the n-type silicon substrate 100, without requiring a special thermal step.

In this way, a solid-state image pickup element in which the gettering ability is strong and maintained for a long term, which has a long lifetime, and which is highly reliable can be provided simply by selecting a high-concentration substrate as a substrate.

In the solid-state image pickup element, the charge transfer electrodes constitute the single-electrode structure in which the first electrode formed by a polycrystalline silicon layer serving as the first conductive film 3a, and the second electrode formed by a polycrystalline silicon layer serving as the second conductive film 3b are alternately juxtaposed via the sidewall insulating film configured by the HTO film 6 formed by the low-pressure CVD method. The single-electrode structure of a low resistance is configured under a low temperature. Therefore, a fine solid-state image pickup element is accurately formed without elongating the diffusion length, and speed-up and miniaturization are enabled.

According to the method, accurate element formation which is free from heavy-metal contamination can be performed, and a minute structure having an interelectrode distance of about 0.1 μm can be formed.

In the embodiment, as described above, the n-type epitaxial growth layer formed on the surface of the n-type silicon substrate of high concentration is used as a substrate for forming a solid-state image pickup element, and hence reduction the lifetime due to occurrence of a white scratch defect is largely improved as compared with the case where a usual silicon substrate is used. Namely, in an epitaxial substrate in which an n-type epitaxial growth layer is formed on the surface of an n-type silicon substrate of high concentration, the gettering ability effectively functions even after a semiconductor device such as a solid-state image pickup element is formed.

In the embodiment, the epitaxial layer is grown with using $SiHCl_3$. In place of $SiHCl_3$, $SiCl_4$, $SiH_2Cl_2$, $SiH_3Cl$, or $SiH_4$ may be used. Particularly, it has been proved that, when $SiH_4$ is used, characteristics of a semiconductor device are further improved.

In the embodiment, the case where phosphorus is used as the n-type impurity has been described. Also in the case where arsenic (As) is used, the same effects are achieved.

According to the substrate for a solid-state image pickup element of the invention, in a thermal step in processing steps, heavy-metal contamination is spontaneously sucked into the n-type silicon substrate which is a heavily-doped impurity region, and the n-type epitaxial growth layer which is an element forming region can constitute a clean functional layer which is free from contamination such as heavy-metal contamination. In the formation of the substrate, no special apparatus is required, and an economical method is employed. Moreover, the gettering layer exists until the final product is formed, and therefore a solid-state image pickup element of high reliability can be formed.

According to the substrate for a solid-state image pickup element of the invention, an impurity and a crystal defect can be strongly gettered, the gettering ability continues for a long term, and the crystallity of the epitaxial layer are less deteriorated. Therefore, the invention is effective in formation of a fine solid-state image pickup element which is excellent in quality and characteristics.

The entire disclosure of each and every foreign patent application from which the benefit of foreign priority has been claimed in the present application is incorporated herein by reference, as if fully set forth.

What is claimed is:

1. A substrate for a solid-state image pickup element, comprising:
   an n-type silicon substrate; and
   an n-type epitaxial growth layer formed on a surface of the n-type silicon substrate,
   wherein the substrate is configured to form a solid-state image pickup element in the n-type epitaxial growth layer, the solid-state image pickup element comprising: a photoelectric converting section; and a charge transferring section having charge transfer electrodes which transfer charges produced in the photoelectric converting section,
   the n-type silicon substrate has a specific resistance of $10/_{1,000}$ Ωcm or less, and
   wherein the n-type epitaxial growth layer has a specific resistance of 0.1 Ωcm or more.

2. A substrate for a solid-state image pickup element according to claim 1, wherein an n-type impurity of the n-type silicon substrate is phosphorus.

3. A substrate for a solid-state image pickup element according to claim 1, wherein an n-type impurity of the n-type silicon substrate is arsenic.

4. A substrate for a solid-state image pickup element according to claim 1, wherein the n-type silicon substrate has an n-type impurity concentration of $5 \times 10^{18}$ cm$^{-3}$ or more.

5. A substrate for a solid-state image pickup element according to claim 2, wherein the n-type silicon substrate has a specific resistance of $3/_{1,000}$ Ωcm or less.

6. A substrate for a solid-state image pickup element according to claim 3, wherein the n-type silicon substrate has a specific resistance of $5/_{1,000}$ Ωcm or less.

7. A substrate for a solid-state image pickup element according to claim 1, wherein all electrode lead terminals are formed on a side of the surface on which the n-type epitaxial growth layer is formed.

8. A solid-state image pickup element comprising:
   a photoelectric converting section; and
   a charge transferring section having charge transfer electrodes which transfer charges produced in the photoelectric converting section,
   wherein the solid-state image pickup element is formed in the n-type epitaxial growth layer of a substrate for a solid-state image pickup element according to claim 1.

9. A method of producing a solid-state image pickup element, the method comprising:

forming, in the n-type epitaxial growth layer of a substrate for a solid-state image pickup element according to claim 1, a photoelectric converting section, and a charge transferring section having charge transfer electrodes which transfer charges produced in said photoelectric converting section, so as to form a solid-state image pickup element.

* * * * *